(12) United States Patent
Kang et al.

(10) Patent No.: US 8,441,443 B2
(45) Date of Patent: May 14, 2013

(54) REMOTE TOUCHPAD DEVICE FOR VEHICLE AND CONTROL METHOD THEREOF

(75) Inventors: Sung Hyun Kang, Suwon-si (KR); Sung-Ho Baik, Gyeonggi-Do (KR)

(73) Assignees: Hyundai Motor Company, Seoul (KR); Daesung Electric Co., Ltd., Ansan, Gyeonggi-Do (KR)

( * ) Notice: Subject to any disclaimer, the term of this patent is extended or adjusted under 35 U.S.C. 154(b) by 632 days.

(21) Appl. No.: 12/628,688

(22) Filed: Dec. 1, 2009

(65) Prior Publication Data

US 2011/0063213 A1    Mar. 17, 2011

(30) Foreign Application Priority Data

Sep. 14, 2009 (KR) .................. 10-2009-0086502

(51) Int. Cl.
*G06F 3/033* (2006.01)
(52) U.S. Cl.
USPC ............................................................ 345/158
(58) Field of Classification Search ............... 345/158, 345/175, 156
See application file for complete search history.

(56) References Cited

U.S. PATENT DOCUMENTS

| | | | | |
|---|---|---|---|---|
| 5,291,195 A | * | 3/1994 | Gross ............................ | 340/958 |
| 5,337,137 A | * | 8/1994 | Ogawa et al. ................ | 356/4.07 |
| 6,713,756 B2 | * | 3/2004 | Yamamoto et al. .......... | 250/231.13 |
| 7,164,116 B2 | * | 1/2007 | Akagi ............................ | 250/221 |
| 7,359,782 B2 | * | 4/2008 | Breed ............................ | 701/45 |
| 7,515,143 B2 | | 4/2009 | Keam et al. | |
| 7,630,806 B2 | * | 12/2009 | Breed ............................ | 701/45 |
| 7,643,159 B2 | * | 1/2010 | Yamamoto et al. .......... | 356/602 |
| 7,783,403 B2 | * | 8/2010 | Breed ............................ | 701/45 |
| 2007/0211022 A1 | | 9/2007 | Boillot | |

FOREIGN PATENT DOCUMENTS

| | | |
|---|---|---|
| JP | 2004-071233 A | 3/2004 |
| JP | 2007-080214 A | 3/2007 |
| KR | 1020070040904 | 4/2007 |
| KR | 1020070082958 | 8/2007 |

* cited by examiner

*Primary Examiner* — Fred Tzeng
(74) *Attorney, Agent, or Firm* — Edwards Wildman Palmer LLP; Peter F. Corless

(57) ABSTRACT

The present invention features a remote touchpad device for a vehicle, which preferably comprises a circuit board having luminous elements installed at predetermined intervals along the circumference of a circle to irradiate light and at least one light-receiving element to receive the light the luminous elements, a pad provided on an upper part of the circuit board to make the light from the luminous elements reflected by an approaching or contact object and incident to the light-receiving element, a controller controlling a user interface by calculating the position of the object with 3D coordinates based on the amount of light incident to the light-receiving element, and a housing forming the exterior of the circuit board, the pad, and the controller. The invention also features a method of controlling the remote touchpad device.

20 Claims, 7 Drawing Sheets

REMOTE TOUCHPAD DEVICE FOR VEHICLE AND CONTROL METHOD THEREOF

CROSS-REFERENCE TO RELATED APPLICATION

This application is based on and claims priority from Korean Patent Application No. 10-2009-0086502, filed on Sep. 14, 2009 in the Korean Intellectual Property Office, the disclosure of which is incorporated herein in its entirety by reference.

BACKGROUND OF THE INVENTION

1. Field of the Invention

The present invention relates, generally, to a remote touchpad device for a vehicle and a control method thereof, and more particularly, to a remote touchpad device for a vehicle and a control method thereof, where the remote touchpad can remotely manipulate a user interface through recognition of three-dimensional coordinate values.

2. Description

Recently, embossing has become important in the interior styling and design of a vehicle, and further a distance between a center fascia, which is an important interface part between a driver and a vehicle, and a front monitor has become longer in a trend towards a design in which the monitor becomes more hollow and the center fascia, which is a part that can be manipulated, is projected forward.

Accordingly, as the design trend has changed, a touch-screen type navigation, which is a representative interface, has become so distant that a touch zone cannot be secured, and there is a need for a remote touchpad device.

Conventional touchpad devices, which have been universally used in notebook computers, mostly adopt a resistance film type, a capacitance type, and the like. Since these touchpad devices are inconvenient to use while driving a vehicle, and are also expensive, there are certain limitations in their application to diverse interfaces. In particular, it is difficult to develop a device for controlling an interface that provides three-dimensional (3D) interaction, and further it is expensive to manufacture such a device.

The above information disclosed in this the Background section is only for enhancement of understanding of the background of the invention and therefore it may contain information that does not form the prior art that is already known in this country to a person of ordinary skill in the art.

SUMMARY OF THE INVENTION

The present invention provides, in preferred aspects, a remote touchpad device for a vehicle and a control method thereof, which enable two-dimensional (2D) recognition and three-dimensional (3D) recognition, and that has a high rate of recognition of coordinate values. Further, the remote touchpad device of the present invention can preferably be manufactured with simple components to save the manufacturing cost.

In preferred embodiments, the present invention provides a remote touchpad device for a vehicle comprising a circuit board having a plurality of luminous elements installed thereon at predetermined intervals along the circumference of a circle to irradiate light, at least one light-receiving element suitably mounted thereon to receive the light irradiated from the plurality of luminous elements; a pad provided on an upper part of the circuit board to make the light irradiated from the plurality of luminous elements suitably reflected by an approaching or contact object and incident to the light-receiving element; a controller controlling a user interface by calculating the position of the object with three-dimensional (3D) coordinates (i.e. X-axis, Y-axis, and Z-axis coordinates) based on the amount of light incident to the light-receiving element; and a housing suitably forming the exterior of the circuit board, the pad, and the controller.

In certain preferred embodiments, the remote touchpad device for a vehicle may further include a compensation element provided thereon to emit light having an opposite phase to the light incident to the light-receiving element. preferably, the plurality of luminous elements and the compensation element may be infrared light-emitting diodes (LEDs).

In further preferred embodiments, the remote touchpad device for a vehicle may include a prism combined in a body with the compensation element in a position where the prism faces the light-receiving element to make the light from the compensation element directly incident to the light-receiving element.

In other preferred embodiments, the plurality of luminous elements may include four luminous elements arranged by 90° in positions where light distributions suitably overlap each other around the light-receiving element.

Preferably, the remote touchpad device according to an exemplary embodiment of the present invention may further include a frame provided with a partition formed between the circuit board and the pad to separate the light-receiving element from the plurality of luminous elements.

In certain preferred embodiments, the housing may include an upper housing having an exposure part formed thereon to make the pad exposed, and a lower housing suitably combined in a body with the upper housing; wherein a lighting part is preferably provided in the neighborhood of the exposure part to make brightness differ in accordance with a height (i.e. the Z-axis coordinates) between the object and the pad based on the coordinates calculated by the controller.

Preferably, the light-receiving element may be a photo-diode.

In another preferred embodiment of the present invention, there is provided a method of controlling a touchpad device for a vehicle, having a plurality of luminous elements to irradiate light, at least one light-receiving element to suitably receive the light irradiated from the plurality of luminous elements, and a pad making the light irradiated from the plurality of luminous elements reflected by an approaching or contact object and incident to the light-receiving element, which includes the steps of converting the amount of light, which is irradiated from the plurality of luminous elements, reflected by the object approaching or contacting the pad, and then incident to the light-receiving element, into the amount of current; compensating for converting an alternating current to a direct current through emission of light having an opposite phase to the light incident to the light-receiving element; calculating the position of the object with three-dimensional (3D) coordinates (i.e. X-axis, Y-axis, and Z-axis coordinates) based on the amount of light compensated; and making a user interface operate in accordance with the 3D coordinates.

Preferably, the method of controlling a touchpad device according to an exemplary embodiment of the present invention may further include the step of displaying an approaching distance of the object to the pad based on the Z-axis coordinates of the calculated 3D coordinates (i.e. X-axis, Y-axis, and Z-axis coordinates).

Preferably, the brightness of illumination may become higher as the approaching distance between the pad and the object becomes nearer.

According to further preferred embodiments of the present invention as described herein, two-dimensional (2D) recognition and three-dimensional (3D) recognition is employed, and thus the present invention can be applied to a user interface providing the 3D interaction. In further preferred embodiments, the remote touch pad device according to the present invention can be suitably manufactured with simple components, and thus the manufacturing cost can be saved.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum).

As referred to herein, a hybrid vehicle is a vehicle that has two or more sources of power, for example both gasoline-powered and electric-powered.

The above features and advantages of the present invention will be apparent from or are set forth in more detail in the accompanying drawings, which are incorporated in and form a part of this specification, and the following Detailed Description, which together serve to explain by way of example the principles of the present invention.

BRIEF DESCRIPTION OF THE DRAWINGS

The above and other objects, features and advantages of the present is invention will be more apparent from the following detailed description taken in conjunction with the accompanying drawings, in which.

Figure 1:
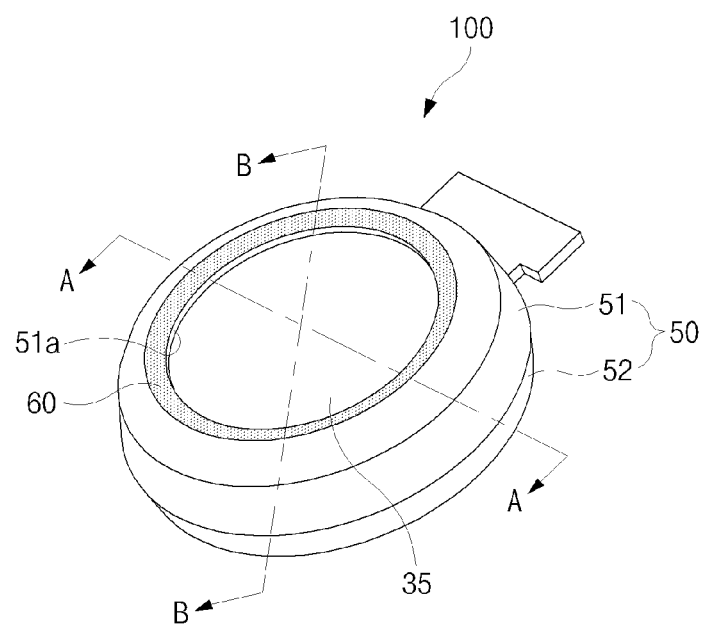
FIG. 1 is an exemplary perspective view of a remote touchpad device for a vehicle in a combined state according to the present invention.
Figure 2:
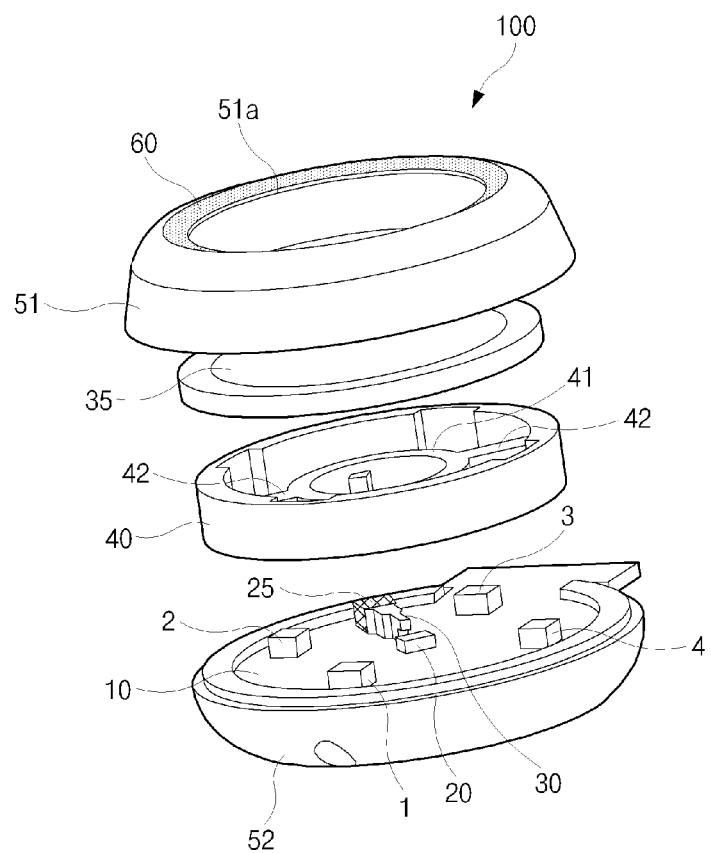
FIG. 2 is an exemplary perspective view of the remote touchpad device of FIG. 1 in a separated state.
Figure 3:
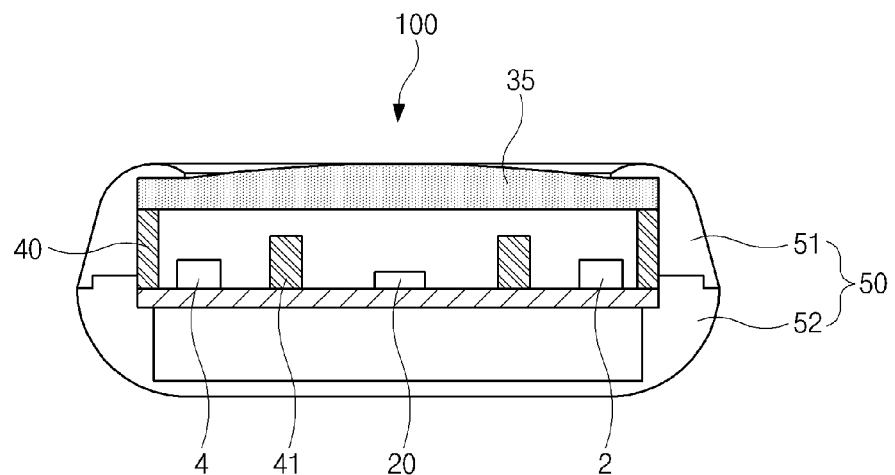
FIG. 3 is a sectional view taken along line A-A of FIG. 1
Figure 4:
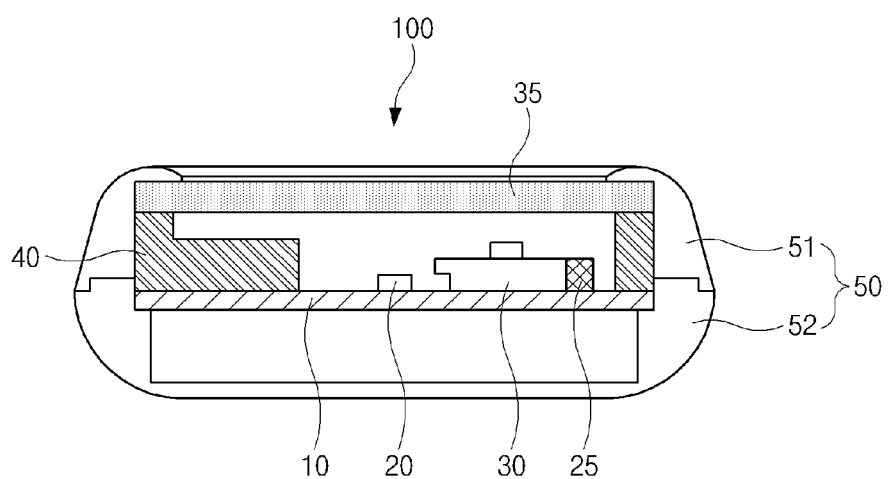
FIG. 4 is a section view taken along line B-B of FIG. 1.
Figure 5:
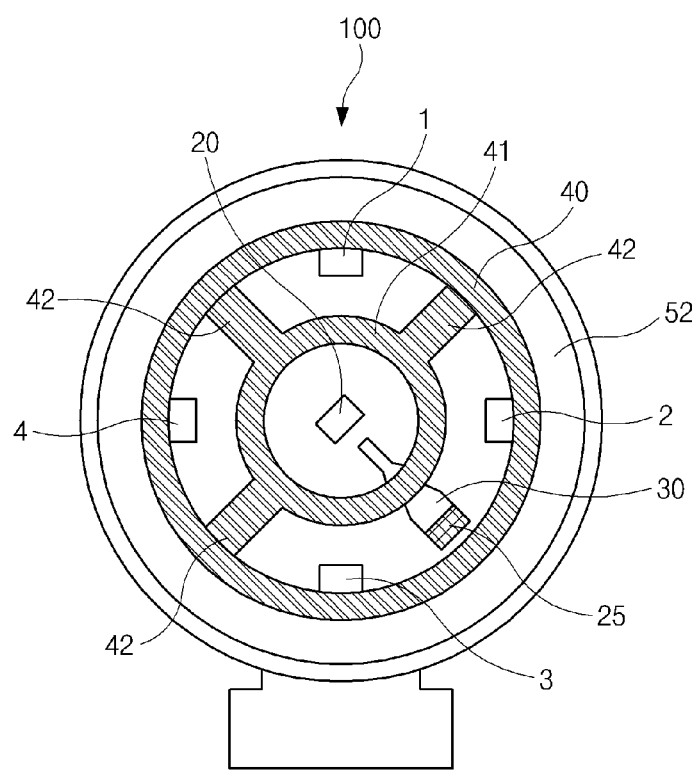
FIG. 5 is an exemplary top view of the remote touchpad device of FIG. 1, from which an upper housing has been removed.

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

DETAILED DESCRIPTION

As described herein, the present invention includes a remote touchpad device for a vehicle, comprising a circuit board comprising a plurality of luminous elements, a pad provided on an upper part of the circuit board, a controller controlling a user interface, and a housing.

In one embodiment, the luminous elements are installed at predetermined intervals along the circumference of a circle to irradiate light.

In another embodiment, the circuit board further comprises at least one light-receiving element mounted thereon to receive the light irradiated from the plurality of luminous elements.

In a further embodiment, the pad is used to make the light irradiated from the plurality of luminous elements reflected by an approaching or contact object and incident to the light-receiving element.

In another further embodiment, the controller controls the user interface by calculating the position of the object with three-dimensional (3D) coordinates based on the amount of light incident to the light-receiving element.

In one embodiment, the 3D coordinates are X-axis, Y-axis, and Z-axis coordinates.

In another embodiment, the housing forms the exterior of the circuit board, the pad, and the controller.

In another aspect, the invention features a touchpad device for a vehicle comprising converting the amount of light reflected by an object approaching or contacting the pad into an amount of current, compensating for the current, calculating the position of the object with three-dimensional (3D) coordinates based on the amount of compensation, and making a user interface operate in accordance with the 3D coordinates.

In one embodiment, the light is irradiated from a plurality of luminous elements.

In another embodiment, compensating for converting an alternating current to a direct current through emission of light having an opposite phase to the light incident to the light-receiving element.

In another further embodiment, the 3D coordinates are X-axis, Y-axis, and Z-axis coordinates.

Hereinafter, preferred embodiments of the present invention will be described in greater detail with reference to the accompanying drawings. In the following description, same drawing reference numerals are used for the same elements even in different drawings. The matters defined in the description such as a detailed construction and elements are nothing but the ones provided to assist in a comprehensive understanding of the invention. Thus, it is apparent that the present invention can be carried out without those defined matters. Also, well-known functions or constructions are not described in detail since they would obscure the invention in unnecessary detail.

According to certain exemplary embodiments of the present invention, FIGS. 1 to 5 are views illustrating a remote touchpad device for a vehicle according. Preferably, a remote touchpad device 100 for a vehicle according to the present invention remotely controls a three-dimensional (3D) user interface through recognition of 3D coordinates.

In further preferred embodiments, the remote touchpad device 100 preferably includes a circuit board 10 on which a plurality of luminous elements 1, 2, 3, and 4 and at least one light-receiving element 20 are suitably mounted, a pad 35 for being in contact with an object such as a finger or a pointer (hereinafter referred to as a "finger"), a controller (not illustrated) controlling the user interface by suitably calculating the 3D coordinates, and a housing 50 forming the exterior of the device to accommodate the above-described components 10 and 35.

Figure 6:
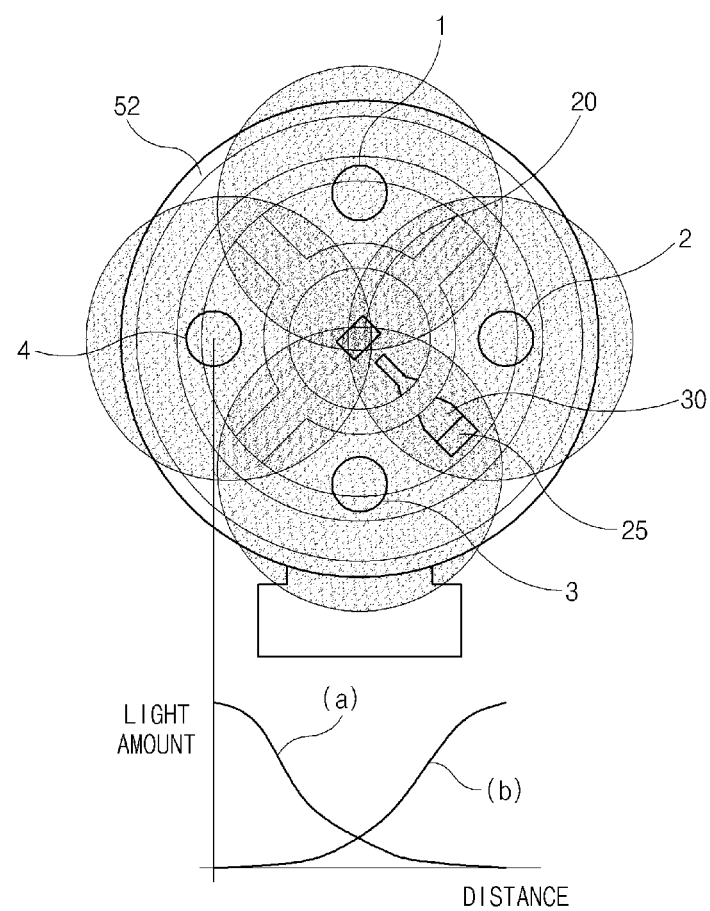
FIG. 6 is an exemplary schematic view showing the light distributions of luminous elements of FIG. 2.

Preferably, the luminous elements 1, 2, 3, and 4 are suitably installed at predetermined intervals along the circumference of a circle, and preferably are suitably arranged one by one by 90°. According to further exemplary embodiments and as illustrated in FIG. 6, it is preferable that the luminous elements 1, 2, 3, and 4 are suitably arranged in positions where light distributions overlap each other around the light-receiving element 20. Accordingly, the luminous elements 1, 2, 3, and 4 are so arranged that the light emitted from the first luminous element overlap the light emitted from the second to fourth luminous elements, respectively, and thus the coordinate recognition performance can be further suitably improved. Preferably, infrared LED emitting infrared rays are used as the luminous elements 1, 2, 3, and 4.

According to further preferred embodiments of the present invention, the amount of light from a light source is suitably reduced as the distance from the light source becomes more distant. Accordingly, line (a) in FIG. 6 is a graph representing the amount of light of the fourth luminous element, and line (b) is a graph representing the amount of light of the second luminous element. Preferably, light is distributed in a manner that the amount of light irradiated from the fourth luminous element is suitably reduced as the light from the fourth luminous element goes to the second luminous element, and the amount of light irradiated from the second luminous element is suitably reduced as the light from the second luminous element goes to the fourth luminous element.

Preferably, the light-receiving element 20 is suitably arranged in the center of the plurality of luminous elements 1, 2, 3, and 4 so that the light irradiated from the luminous elements 1, 2, 3, and 4 and then reflected by a finger is efficiently incident to the light-receiving element. In further preferred embodiments, the amount of light incident to the light-receiving element 20 is suitably converted into the amount of current, and this result is sent to the controller. Preferably, the controller calculates the position of the finger with 3D coordinates in accordance with the amount of current received from the light-receiving element 20 to operate a user interface. In the embodiment of the present invention, a photodiode is used as the light-receiving element 20.

Accordingly, in certain exemplary embodiments, the principle of calculating the position of the finger (with 3D coordinates) through the controller is as follows.

Preferably, if a power supply part successively applies power to the first to fourth luminous elements at a speed of about 10 mm/s, infrared rays that are emitted from the luminous elements 1, 2, 3, and 4 through time are reflected by a finger, and then incident to the light-receiving element 20. Accordingly, the controller can grasp the position of the luminous element 1, 2, 3, or 4 that has just emitted the infrared rays. Further, it is required to detect the position of the finger by suitably calculating X-axis, Y-axis, and Z-axis coordinates using the distribution of the infrared rays of the respective luminous elements 1, 2, 3, and 4 which are incident to the light-receiving element 20. Preferably, in further preferred embodiments, since the successive infrared irradiation of the respective luminous elements 1, 2, 3, and 4 forms a loop, and the amounts of infrared light reflected from the finger and then incident to the light-receiving element 20 differ in accordance with the positions between the pad 35 and the finger, the amounts of current produced from the light-receiving element 20 and the amounts of light are changed, and thus the X-axis, Y-axis, and Z-axis coordinates can be suitably detected.

In other certain embodiments, simultaneous applying of power to the first to fourth luminous elements after the successive applying of power to the respective luminous elements 1, 2, 3, and 4 may suitably form a loop to calculate the X-axis, Y-axis, and Z-axis coordinates of the finger.

Accordingly, it is preferable that a compensation element 25 is further provided on the circuit board 10 to emit light having an opposite phase to the light incident to the light-receiving element 20. Preferably, like the luminous elements 1, 2, 3, and 4, an infrared LED may be used as the compensation element 25.

In preferred exemplary embodiments of the invention, when the light (i.e. infrared rays) emitted from the luminous elements 1, 2, 3, and 4 is suitably reflected by a finger and is incident to the light-receiving element 20, the compensation element 25 suitably emits light (i.e. infrared rays) having an opposite phase to the incident AC infrared light to make the current produced from the light-receiving element 20 in a straight line.

Accordingly, since the currents produced after the lights (i.e. infrared rays) emitted from the luminous elements 1, 2, 3, and 4 are incident to the light-receiving element 20 overlap each other and serve as noises, it is not easy to suitably discriminate between data from the respective luminous elements 1, 2, 3, and 4. Accordingly, the compensation element 25 emits the light having an opposite phase to the lights emitted from the luminous elements to send only the current in the straight line to the controller.

In other further embodiments, it is preferable that a prism 30 is suitably combined in a body with the compensation element 25 in a position where the prism faces the light-receiving element 20 to make the light from the compensation element 25 directly incident to the light-receiving element 20. Accordingly, the light from the compensation element 25 is directly incident to the light-receiving element 20 without being suitably affected by the outside. In further preferred embodiments, the prism 30 may be made of a transparent material such as plastic or glass so that the light from the compensation element 25 can easily pass through the prism 30.

Preferably, the pad 35 is suitably provided on an upper side of the luminous elements 1, 2, 3, and 4, and is made of a transparent material such as plastic or glass so that the light (i.e. infrared rays) irradiated from the luminous elements 1, 2, 3, and 4 can pass through the pad 35. In further preferred embodiments of the present invention, it is preferable that the pad 35 is made of a material through which only infrared rays pass so as to suitably prevent other external lights (from the sun or lighting fixtures) from being incident to the light-receiving element 20. Further, since the pad 35 is greatly affected by light, it is preferable that it has a smooth flat surface. However, in order to be agreeable to the touch, the pad may suitably permit curvature.

Preferably, the pad 35 is safely placed on the upper surface of the frame 40 provided on the lower side of the pad 35.

According to further preferred embodiments of the present invention, the frame 40, which is provided between the circuit board 10 and the pad 35, has a partition 41 that is suitably formed in the center thereof to separate the light-receiving element 20 from the plurality of luminous elements 1, 2, 3, and 4, and thus the lights emitted from the luminous elements 1, 2, 3, and 4 are prevented from being directly incident to the light-receiving element 20. In further related embodiments, it is preferable that between the frame 40 and the partition 41, a separation plate 42 is suitably formed so that luminous elements 1, 2, 3, and 4 have no effect on each other.

Preferably, the housing 50 is to form the exterior of the remote touchpad device 100, and preferably includes an upper housing 51 on which an exposure part 51a for exposing the pad 35 is formed, and a lower housing 52 suitably combined in a body with the upper housing 51.

Accordingly, in further preferred embodiments, the upper housing 51 and the lower housing 52 are made of a plastic or metal material. Preferably, the upper housing 51 serves to suitably support the pad 35, and is formed of an opaque material to suitably prevent the infrared rays from the luminous elements 1, 2, 3, and 4 from being radiated to another place.

In certain exemplary embodiments, it is preferable that in the neighborhood of the exposure part 51a, a lighting part 60 for indicating the approaching distance (i.e. the Z-axis coordinates) of the finger to the pad 35 based on the 3D coordinates (i.e. X-axis, Y-axis, and Z-axis coordinates) calculated by the controller is suitably installed to provide a feedback to a user. Accordingly, it is preferable that the brightness becomes higher by stages as the height between the pad 35 and the finger becomes suitably lowered. In other further embodiments, the lighting part 60 may emit lights of different colors in accordance with the height between the pad 35 and the finger. Preferably, the feature of the light part 60 is not limited thereto, but may be diversely implemented.

According to certain exemplary embodiments with the above-described construction, a method of controlling the remote touchpad device 100 according to the present invention is described with reference to FIGS. 7a to 7c.

Figure 7A:
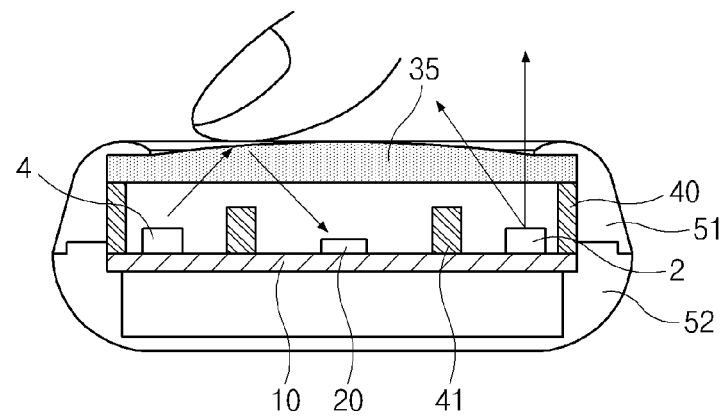
FIG. 7a is an exemplary schematic view illustrating a light path in the event that a finger is in contact with a pad on the fourth luminous element.

According to a preferred exemplary embodiment and as shown in FIG. 7, FIG. 7a illustrates a state where the finger is in contact with the pad 35 just over the fourth luminous element. As shown in FIG. 7a, the light (i.e. infrared rays) from the fourth luminous element just below the finger passes through the pad 35, is reflected by the finger, and then is incident to the light-receiving element 20. Preferably, the light (i.e. infrared rays) from the second luminous element on which no finger is placed passes through the pad 35, and then is radiated in the air.

Figure 7B:
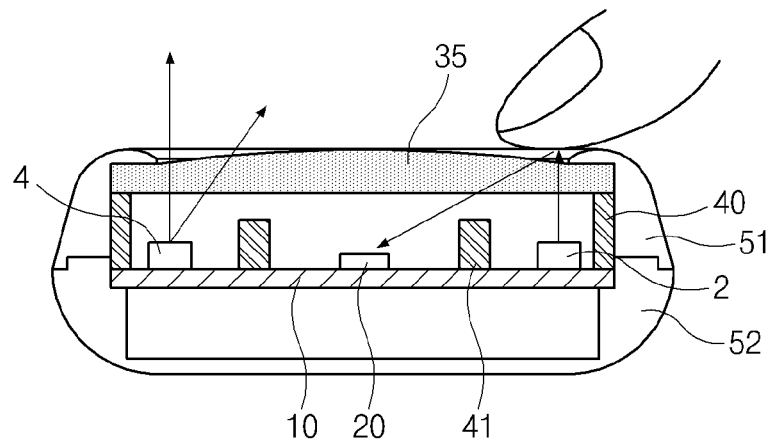
FIG. 7b is an exemplary schematic view illustrating a light path in the event that a finger is in contact with a pad on the second luminous element.

In a further preferred embodiment, if the finger moves from the fourth luminous element toward the second luminous element, as shown in FIG. 7b, the light irradiated from the fourth luminous element preferably passes through the pad 35, and then is radiated in the air, while the light from the second luminous element preferably passes through the pad 35, is reflected by the finger, and then is incident to the light-receiving element 20.

Accordingly, as the finger moves from the fourth luminous element to the second luminous element, the amount of light, which is irradiated from the fourth luminous element, is suitably reflected by the finger, and then is incident to the light-receiving element 20, is reduced. In other certain embodiments, if the finger passes through the center and approaches the second luminous element, the light emitted from the fourth luminous element is not suitably reflected by the finger, but goes out in the air, while only the light emitted from the second luminous element is suitably reflected by the finger, and then is incident to the light-receiving element 20. Accordingly, as the amount of current produced from the light-receiving element 20 is suitably changed in accordance with the position of the finger, the X-axis, Y-axis, and Z-axis coordinate values are recognized.

Figure 7C:
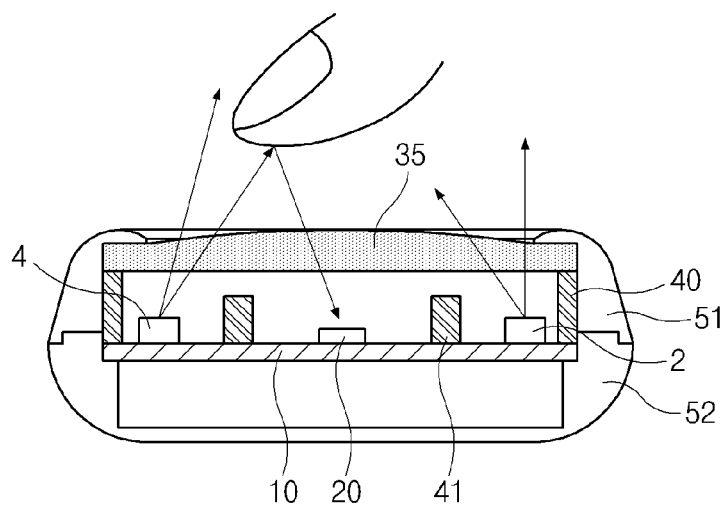
FIG. 7c is an exemplary schematic view illustrating a light path in the event that a finger is apart for a specified distance from a pad.

According to other further exemplary embodiments, even in a state where the finger is apart for a predetermined distance from the pad 35 as shown in FIG. 7c, the amount of current is suitably changed in accordance with the amount of light reflected by the finger and then incident to the light-emitting device 20, and thus the X-axis, Y-axis, and Z-axis coordinate values can be suitably recognized.

As described herein, the amount of light incident to the light-receiving element 20 is changed in accordance with the position of the finger, and thus the 3D coordinates are suitably recognized.

According to further preferred embodiments of the present invention, before the controller calculates the 3D coordinates, the compensation element 25 emits light having an opposite phase to the light incident to the light-receiving element 20 when the light is incident to the light-receiving element 20. Accordingly, the light reflected by the finger and then incident to the light-receiving element 20 is made in a straight line by the light emitted from the compensation element 25, and the current in the straight line is preferably sent to the controller so that the position of the finger is calculated with the 3D coordinates (i.e. X-axis, Y-axis, and Z-axis coordinates).

Preferably, the controller makes the user interface operate in accordance with the 3D coordinates.

Accordingly, in further preferred embodiments, the controller makes the light part 60 display the height between the finger and the pad 35 (the approaching distance of the finger to the pad 35) based on the Z-axis coordinates among the calculated 3D coordinates during the above-described process to provide the feedback to the user. For example, if the height between the finger and the pad 35 is in the range of 20~10 cm, the controller suitably controls the lighting part 60 to display a thin red color, while if the height between the finger and the pad 35 is in the range of 10~8 cm, the controller controls the lighting part 60 to display an intermediate red color. Preferably, if the height between the finger and the pad 35 is 0 cm (i.e. the state where the finger is in contact with the pad 35), the controller controls the lighting part to display a deep red color, so that the user can easily recognize the height between the finger and the pad.

As described herein, according to the present invention, two-dimensional (2D) recognition and three-dimensional (3D) recognition is possible, and thus the present invention can be applied to a user interface providing 3D interaction. The remote touch pad device according to the present invention has a high rate of recognition of the coordinate values, and further can be manufactured with simple components to reduce the manufacturing cost.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A remote touchpad device for a vehicle, comprising:
 a circuit board having a plurality of luminous elements installed thereon at predetermined intervals along the circumference of a circle to irradiate light and at least one light-receiving element mounted thereon to receive the light irradiated from the plurality of luminous elements;
 a pad provided on an upper part of the circuit board to make the light irradiated from the plurality of luminous elements reflected by an approaching or contact object and incident to the light-receiving element;
 a controller controlling a user interface by calculating the position of the object with three-dimensional (3D) coordinates (i.e. X-axis, Y-axis, and Z-axis coordinates) based on the amount of light incident to the light-receiving element; and
 a housing forming the exterior of the circuit board, the pad, and the controller.

2. The remote touchpad device of claim 1, further comprising a compensation element provided on the circuit board to emit light having an opposite phase to the light incident to the light-receiving element.

3. The remote touchpad device of claim 2, further comprising a prism combined in a body with the compensation element in a position where the prism faces the light-receiving element to make the light from the compensation element directly incident to the light-receiving element.

4. The remote touchpad device of claim 2, wherein the plurality of luminous elements and the compensation element are infrared light-emitting diodes (LEDs).

5. The remote touchpad device of claim 1, wherein the plurality of luminous elements includes four luminous elements arranged one by one by 90° in positions where light distributions overlap each other around the light-receiving element.

6. The remote touchpad device of claim 5, further comprising a frame provided with a partition formed between the circuit board and the pad to separate the light-receiving element from the plurality of luminous elements.

7. The remote touchpad device of claim 1, wherein the housing comprises:
an upper housing having an exposure part formed thereon to make the pad exposed; and
a lower housing combined in a body with the upper housing;
wherein a lighting part is provided in the neighborhood of the exposure part to make brightness differ in accordance with a height (i.e. the Z-axis coordinates) between the object and the pad based on the coordinates calculated by the controller.

8. The remote touchpad device of claim 1, wherein the light-receiving element is a photodiode.

9. A method of controlling a touchpad device for a vehicle, having a plurality of luminous elements to irradiate light, at least one light-receiving element to receive the light irradiated from the plurality of luminous elements, and a pad making the light irradiated from the plurality of luminous elements reflected by an approaching or contact object and incident to the light-receiving element, the method comprising:
converting the amount of light, which is irradiated from the plurality of luminous elements, reflected by the object approaching or contacting the pad, and then incident to the light-receiving element, into an amount of current;
compensating for converting an alternating current to direct current through emission of light having an opposite phase to the light incident to the light-receiving element;
calculating the position of the object with three-dimensional (3D) coordinates (i.e. X-axis, Y-axis, and Z-axis coordinates) based on the amount of the current compensated; and
making a user interface operate in accordance with the 3D coordinates.

10. The method of claim 9, further comprising the step of displaying an approaching distance of the object to the pad based on the Z-axis coordinates of the calculated 3D coordinates (i.e. X-axis, Y-axis, and Z-axis coordinates).

11. The method of claim 10, wherein the brightness of illumination becomes higher as the approaching distance between the pad and the object becomes nearer.

12. A remote touchpad device for a vehicle, comprising:
a circuit board comprising a plurality of luminous elements;
a pad provided on an upper part of the circuit board;
a controller controlling a user interface; and
a housing,
wherein the circuit board further includes at least one light-receiving element mounted thereon to receive the light irradiated from the plurality of luminous elements, and
the controller controls the user interface by calculating the position of the object with three-dimensional (3D) coordinates based on the amount of light incident to the at least one light receiving element.

13. The remote touchpad device of claim 12, wherein the luminous elements are installed at predetermined intervals along the circumference of a circle to irradiate light.

14. The remote touchpad device of claim 12, wherein the pad is used to make the light irradiated from the plurality of luminous elements reflected by an approaching or contact object and incident to the light-receiving element.

15. The remote touchpad device of claim 12, wherein the 3D coordinates are X-axis, Y-axis, and Z-axis coordinates.

16. The remote touchpad device of claim 12, wherein the housing forms the exterior of the circuit board, the pad, and the controller.

17. A method of controlling a touchpad device for a vehicle comprising:
converting an amount of light, which is irradiated from a plurality of luminous elements, reflected by an objecting approaching or contacting the touchpad, and then incident to a light-receiving element, into an amount of current;
compensating for the current;
calculating the position of the object with three-dimensional (3D) coordinates based on the amount of compensation; and
making a user interface operate in accordance with the 3D coordinates.

18. The method of claim 17, wherein the light is irradiated from a plurality of luminous elements.

19. The method of claim 17, wherein compensating for the current comprises making the current in a straight line through emission of light having an opposite phase to the light incident to the light-receiving element.

20. The method of claim 17, wherein the 3D coordinates are X-axis, Y-axis, and Z-axis coordinates.

* * * * *